(12) United States Patent
Yoshioka

(10) Patent No.: US 7,200,029 B2
(45) Date of Patent: Apr. 3, 2007

(54) FERROELECTRIC STORAGE DEVICE

(75) Inventor: Hiroshi Yoshioka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/258,227

(22) Filed: Oct. 26, 2005

(65) Prior Publication Data

US 2007/0008766 A1    Jan. 11, 2007

(30) Foreign Application Priority Data

Jul. 6, 2005    (JP)    ............................... 2005-197945

(51) Int. Cl.
*G11C 11/22*    (2006.01)
(52) U.S. Cl. .................... 365/145; 365/156; 365/203; 365/207
(58) Field of Classification Search ................ 365/145, 365/156, 203, 207, 210
See application file for complete search history.

(56) References Cited

U.S. PATENT DOCUMENTS 6,876,568 B2 * 4/2005 Ueda et al. .................. 365/145

2005/0174830 A1 * 8/2005 Lee et al. ..................... 365/145
2005/0265065 A1 * 12/2005 Yoshioka et al. ............ 365/145

FOREIGN PATENT DOCUMENTS

| JP | 2001-319472 | 11/2001 |
| JP | 2004-013951 | 1/2004 |

\* cited by examiner

*Primary Examiner*—Tuan T. Nguyen
*Assistant Examiner*—Toan Le
(74) *Attorney, Agent, or Firm*—Arent Fox PLLC

(57) ABSTRACT

A ferroelectric storage device includes a ferroelectric capacitor C1, a bit line BL, a first switching element 103 selectively connecting the ferroelectric capacitor C1 and the bit line BL, a first transistor 203 connected to the bit line BL and to a reference potential, a reference ferroelectric capacitor CR1, a reference bit line Lref, a reference switching element 105 selectively connecting the reference ferroelectric capacitor CR1 and the reference bit line Lref, a second transistor 201 connected to the reference bit line Lref and to the reference potential, potential control circuits 110 and 200 controlling a potential of the bit line BL and a potential of the reference bit line Lref, and a timing control circuit 210 controlling a detection timing for detecting data on the bit line.

11 Claims, 14 Drawing Sheets

FERROELECTRIC STORAGE DEVICE

CROSS-REFERENCE TO RELATED APPLICATIONS

This application is based upon and claims the benefit of priority from the prior Japanese Patent Application No. 2005-197945, filed in Jul. 6, 2005, the entire contents of which are incorporated herein by reference.

BACKGROUND OF THE INVENTION

The present invention relates to a ferroelectric storage device.

A ferroelectric capacitor, though nonvolatile, has a characteristic capable of reading and writing data at a high speed. The ferroelectric capacitor is utilized for a ferroelectric memory (FeRAM (Ferroelectric Random Access Memory)) by making the use of this characteristic.

A readout characteristic of a cell potential of the ferroelectric memory, as in the case of a DRAM (Dynamic RAM), depends on a ratio of a ferroelectric capacitor that are provided in the cell to a bit line capacitor. With the high integration of the memory, as a memory area is reduced, a capacitor of the bit line decreases. As a result, in voltages applied to the ferroelectric capacitor and the bit line capacitor, the voltage applied to the ferroelectric capacitor decreases. With this decrease, an electric charge supplied to the bit line from the ferroelectric capacitor is reduced, and a readout margin of a sense amplifier decreases. A contrivance considered for this point is that the voltage applied to the ferroelectric capacitor of the cell is prevented from decreasing by adding a capacitor load onto the bit line.

In this case, however, a capacitor corresponding to the ferroelectric capacitor of the cell is needed as the capacitor added to the bit line. If such a capacitor is actualized by a gate capacitor, a source/drain capacitor or the ferroelectric capacitor, an increase in area is brought about. Further, the ferroelectric capacitor has a problem that restraint of a variation of the characteristic is insufficient, and so on. It should be noted that the following Patent documents 1 and 2 each disclose the ferroelectric capacitor.

[Patent document 1] Japanese Patent Laid-Open Publication No. 2001-319472

[Patent document 2] Japanese Patent Laid-Open Publication No. 2004-13951

SUMMARY OF THE INVENTION

It is an object of the invention to provide a ferroelectric storage device having a preferable readout characteristic irrespective of a magnitude of the bit line capacitor.

The invention adopts the following means in order to solve the problems. Namely, the invention is a ferroelectric storage device comprising a ferroelectric capacitor retaining data by polarization, a bit line via which the data is inputted and outputted to the ferroelectric capacitor, a first switching element selectively connecting the ferroelectric capacitor and the bit line, a first transistor connected to the bit line and to a reference potential, a reference ferroelectric capacitor retaining fixed data, a reference bit line via which the data is inputted and outputted to the reference ferroelectric capacitor, a reference switching element selectively connecting the reference ferroelectric capacitor and the reference bit line, a second transistor connected to the reference bit line and the reference potential, a potential control circuit controlling a potential of the bit line when the bit line is connected to the ferroelectric capacitor, and controlling a potential of the reference bit line when the reference bit line is connected to the reference ferroelectric capacitor, and a timing control circuit controlling a detection timing for detecting the data of the bit line.

According to the ferroelectric storage device, the potential control circuit controls the potentials of the bit line and the reference bit line, whereby the potentials can be properly shared between the bit line capacitor and the ferroelectric capacitor. Therefore, the data outputted to the bit lines can be stably detected. Further, the timing control circuit that controls the detection timing for detecting the data on the bit lines is provided, whereby the data outputted to the bit lines can be detected at a proper timing.

Further, the invention may also be a ferroelectric storage device comprising ferroelectric capacitors each retaining complementary data, bit lines receiving respective outputs of pieces of complementary data from the ferroelectric capacitors, and a detection circuit detecting a potential difference between these pieces of complementary data before the two pieces of complementary data outputted to the bit lines are stabilized. According to the ferroelectric storage device, the potential difference between the pieces of complementary data is detected before both of the complementary data outputted to the bit lines are stabilized, and hence there increases a possibility enabling the detection of a much larger potential difference than in the case of detecting the potential difference between the pieces of complementary data after the both have been stabilized.

According to the invention, the ferroelectric memory having a preferable readout characteristic can be obtained irrespective of a capacitance value of the bit line.

DETAILED DESCRIPTION OF THE INVENTION

A ferroelectric memory according to a best mode (which will hereinafter be referred to as an embodiment) for carrying out the invention, will hereinafter be described with reference to the drawings. A configuration of the following embodiment is an exemplification, and the invention is not limited to the configuration of the embodiment.

First Embodiment

A first embodiment of the invention will hereinafter be explained with reference to the drawings in FIGS. 1 through 7 and FIGS. 11 through 14.

<Principle of Ferroelectric Memory>

Figure 11:
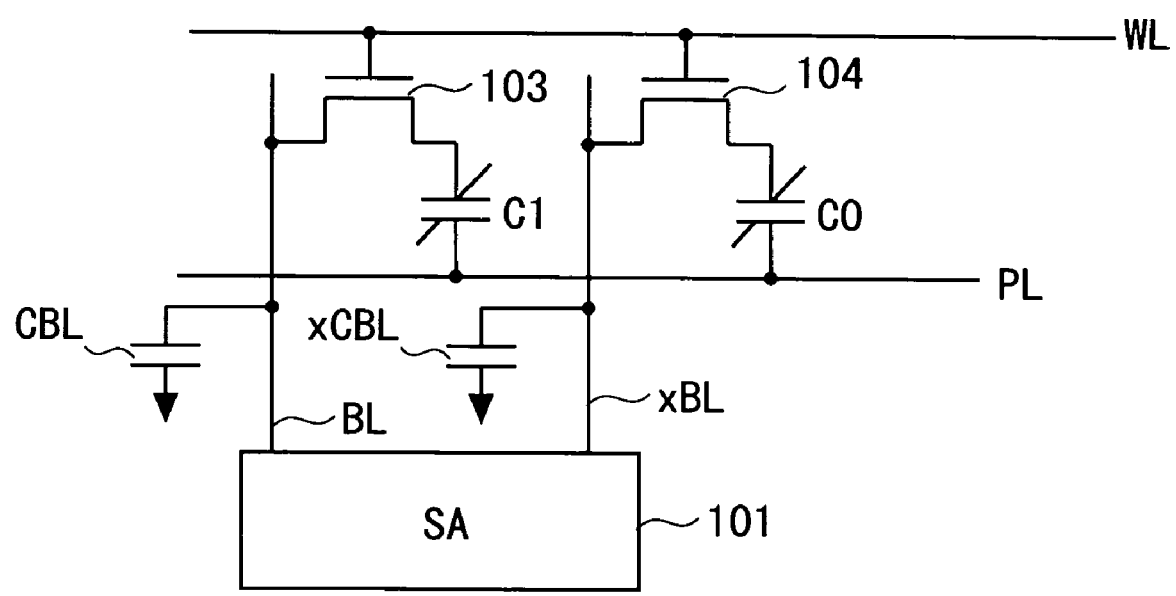
FIG. 11 is a circuit diagram showing an example of the configuration of the ferroelectric memory.

FIG. 11 is a circuit diagram showing an example of a configuration of the ferroelectric memory. This circuit includes ferroelectric capacitors C1 and C0 that store complementary data on each other, a bit line BL and a complementary bit line xBL that serve to input and output the data of the respective ferroelectric capacitors C1 and C0, an n-channel MOS (Metal-Oxide Semiconductor) field-effect transistor (FET) 103 that selectively connects the ferroelectric capacitor C1 and the bit line BL, an n-channel MOSFET 104 that selective connects the ferroelectric capacitor C0 and the complementary bit line xBL, a word line WL for controlling gate voltages of the n-channel MOSFETs 103 and 104, a plate line connected to a terminal on the opposite side to the n-channel MOSFET 103 (and 104) of the ferroelectric capacitor C1 (and C0), and a sense amplifier 101 for amplifying a potential difference between the bit line BL and the complementary bit line xBL. The n-channel MOSFET will hereinafter be (simply) called a transistor.

Thus, a gate of the transistor 103 (corresponding to a first switching element according to the invention) is connected to the word line WL, a drain thereof is connected to the bit line BL, and a source thereof is connected to the plate line PL via the ferroelectric capacitor C1. A gate of the transistor 104 (corresponding to a second switching element according to the invention) is connected to the word line WL, a drain thereof is connected to the complementary bit line xBL, and a source thereof is connected to the plate line PL via the ferroelectric capacitor C0. A parasitic capacitor CBL exists between the bit line BL and a ground potential (corresponding to a reference potential according to the invention), and a parasitic capacitor xCBL exists between the complementary bit line xBL and the ground potential. One single memory cell is built up based on the configuration given above. Further, the transistors 103 and 104 function as switching elements.

The ferroelectric capacitor C0 (corresponding to a complementary ferroelectric capacitor according to the invention) and the ferroelectric capacitor C1 store the complementary data on each other. Namely, when the ferroelectric capacitor C0 stores the data of "0", the ferroelectric capacitor C1 stores the data of "1", and, when the ferroelectric capacitor C0 stores the data of "1", the ferroelectric capacitor C1 stores the data of "0". The bit line BL and the complementary bit line xBL are each capable of inputting and outputting the data to and from the ferroelectric capacitors C1 and C0. The transistor 103 selectively connects the ferroelectric capacitor C1 and the bit line BL, corresponding to a potential of the word line WL. The transistor 104 selectively connects the ferroelectric capacitor C0 and the complementary bit line xBL, corresponding to the potential of the word line WL. Further, the sense amplifier 101 is connected to the bit line BL and to the complementary bit line xBL, and amplifies the potential difference between the bit line BL and the complementary bit line xBL.

Figure 12:
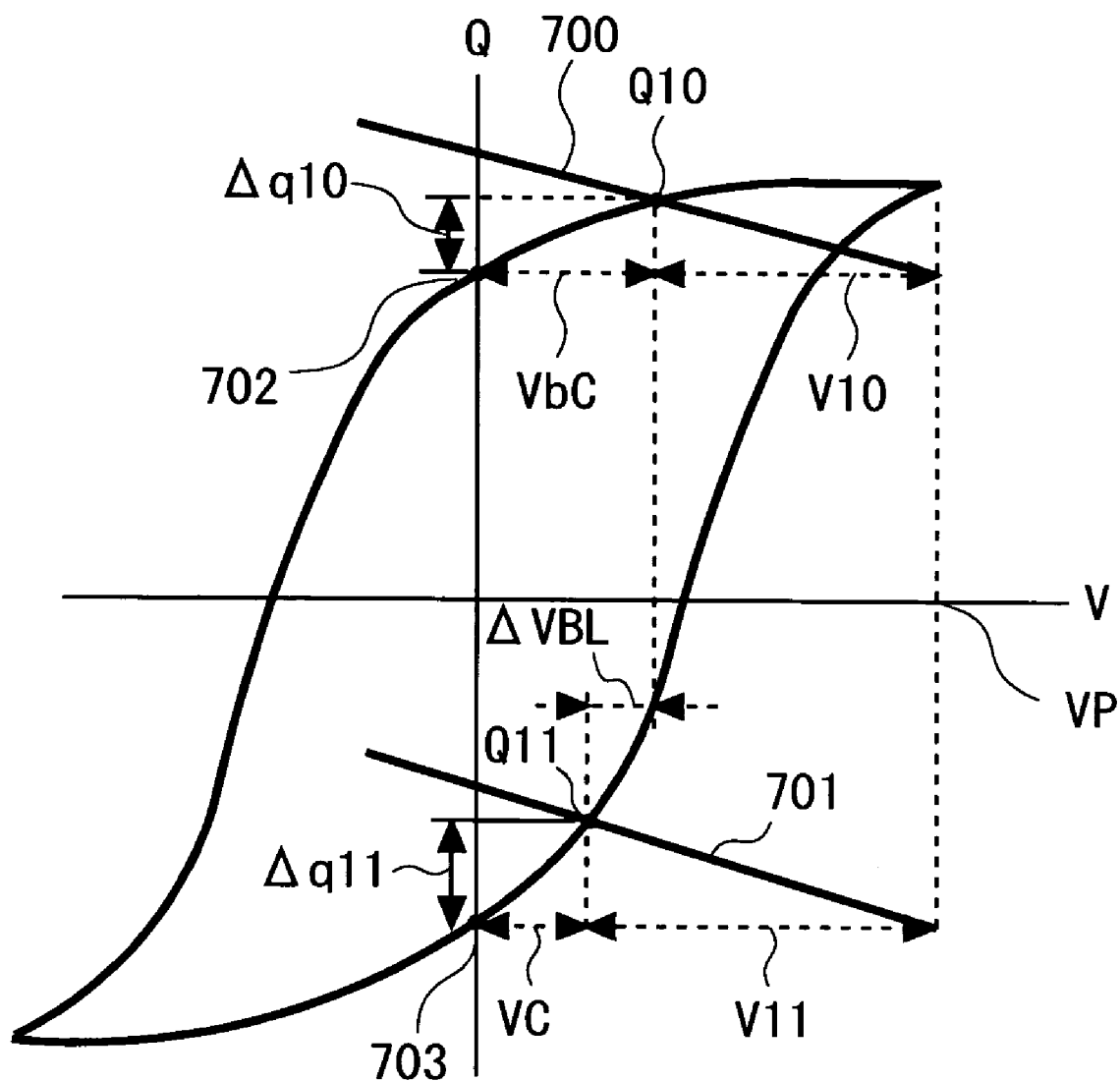
FIG. 12 is a graph showing hysteresis curves of a ferroelectric capacitor and a complementary ferroelectric capacitor.

FIG. 12 is a graph showing hysteresis curves of the ferroelectric capacitor C1 and the ferroelectric capacitor C0 complementary to this capacitor C1. An axis of abscissa in FIG. 12 represents a voltage V between the terminals of both sides of the ferroelectric capacitors, and an axis of ordinates represents a polarized charge Q. For example, when the plate line PL is at 0 volt, two states 702 and 703 can exist. An explanation is given herein on the assumption that for example, the ferroelectric capacitor C1 is in the state 703, and the ferroelectric capacitor C0 is in the state 702.

When a potential VP is applied to the plate line PL, the ferroelectric capacitor C1 comes to a state Q11. At this time, the voltage VP is applied to a series connection between the ferroelectric capacitor C1 and the bit-line parasitic capacitor CBL. In the example in FIG. 12, the voltage of the ferroelectric capacitor C1 is VC, and the voltage of the bit-line parasitic capacitor CBL becomes V11. These voltages are determined substantially in inverse proportion to a capacitance ratio of the ferroelectric capacitor C1 to the bit-line parasitic capacitor CBL. A total of the voltage VC and the voltage V11 comes to the voltage VP. A gradient of a straight line 701 indicates a voltage-to-charge ratio corresponding to the bit-line parasitic capacitor CBL. A value of the axis of abscissa in the state Q11 corresponding to a point at which the straight line 701 intersects the hysteresis curve, represents the voltage VC of the ferroelectric capacitor C1.

Further, a difference in value on the axis of ordinates between the state 703 and the state Q11, represents a variation quantity Δq11 of the polarized charge. Moreover, a value C11 corresponding to an equivalent electrostatic capacitance of the ferroelectric capacitor C1, is calculated such as C11=Δq11/VC, where Δq11 is the variation quantity of the polarized charge, and VC is the voltage. As a gradient of a tangential line to the hysteresis curve at Q11 shown in the graph in FIG. 12 becomes larger, the variation quantity of the polarized charge with respect to the voltage gets larger, and the equivalent electrostatic capacitance (capacitor) C11 comes to have a greater value.

On the other hand, the ferroelectric capacitor C0 comes to a state Q10 when the potential VP is applied to the plate line PL. At this time, the voltage VP is applied to the series connection between the ferroelectric capacitor C0 and the complementary bit-line parasitic capacitor xCBL. The example in FIG. 12 is that a voltage of the ferroelectric capacitor C0 is VbC, and a voltage of the complementary bit line xBL becomes V10. These voltages are determined substantially in inverse proportion to the capacitance ratio of the ferroelectric capacitor C0 to the complementary bit-line parasitic capacitor xCBL. A total of the voltage VbC and the voltage V10 becomes the voltage VP. A gradient of a straight line 700 indicates a voltage-to-charge ratio corresponding to complementary bit-line parasitic capacitor xCBL. A value of the axis of abscissa in the state Q10 corresponding to a point at which the straight line 700 intersects the hysteresis curve, represents the voltage VbC of the ferroelectric capacitor C0.

Further, a difference in value on the axis of ordinates between the state 702 and the state Q10 represents a variation quantity Δq10 of the polarized charge. Moreover, a value C10 corresponding to an equivalent electrostatic capacitance of the complementary ferroelectric capacitor C0, is calculated such as C10=Δq10/VbC, where Δq10 is the variation quantity of the polarized charge, and VbC is the voltage. As a gradient of a tangential line to the hysteresis curve at Q10 shown in the graph in FIG. 12 becomes smaller, the variation quantity of the polarized charge with respect to the voltage gets smaller, and the equivalent electrostatic capacitance (capacitor) C10 comes to have a smaller value.

In this example, the potential of the bit line BL is V11, the potential of the complementary bit line xBL is V10. A potential difference therebetween is given by: V11−V10=ΔVBL. The sense amplifier 101 amplifies this potential difference ΔVBL. Therefore, as the potential difference ΔVBL becomes large, a detection margin of the sense amplifier 101 increases, and a storage element exhibiting high reliability can be acquired.

Figure 13:
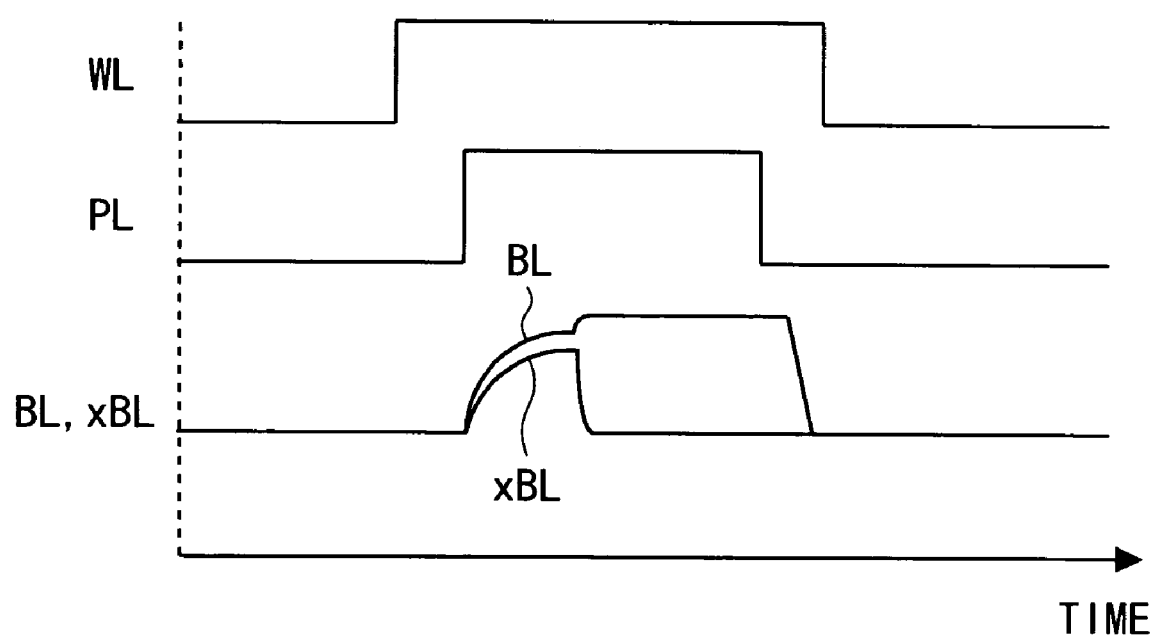
FIG. 13 is an explanatory timing chart of the operation of the ferroelectric memory.
Figure 14:
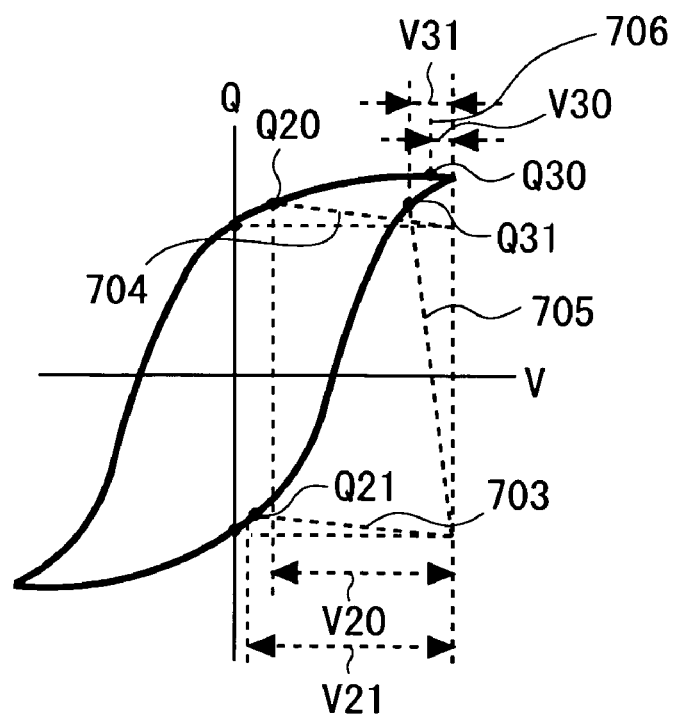
FIGS. 14(A)–14(D) are diagrams exemplifying potentials of the bit line and the complementary bit line with respect to each of states on the hysteresis curves.
Figure 14:
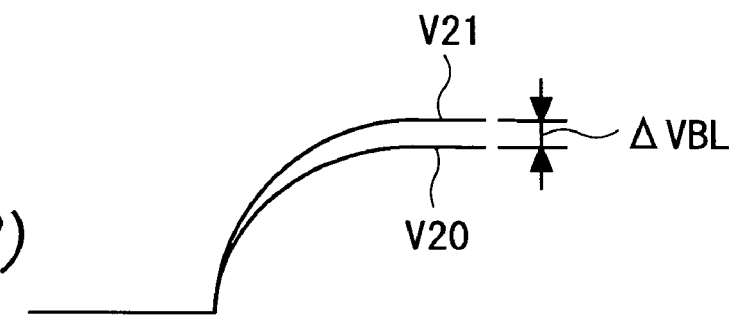
Figure 14:
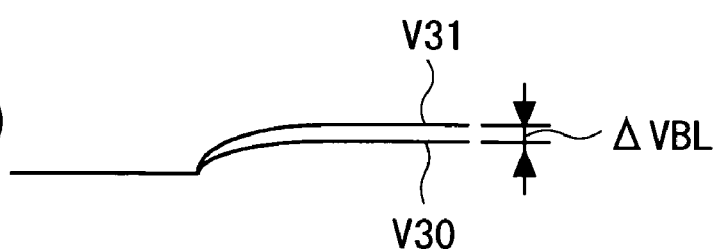
Figure 14:
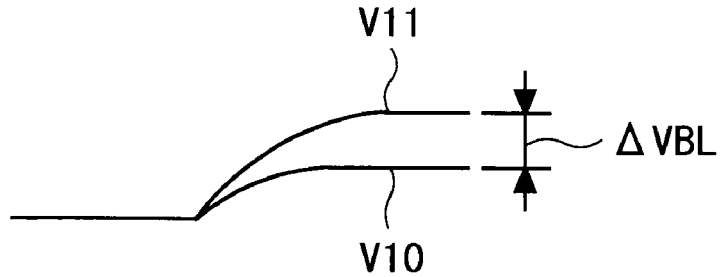

FIG. 13 is an explanatory timing chart of how the ferroelectric memory operates. When the potential of the word line WL is at a low level, the transistors 103 and 104 are kept OFF. At this time, the bit line BL is disconnected from the ferroelectric capacitor C1, and the potential thereof can be assumed to be 0 volt. Further, the complementary bit line xBL is disconnected from the ferroelectric capacitor C0, and the potential thereof can be assumed to be 0 volt.

Next, when the potential of the word line WL reaches a high level, the transistors 103 and 104 are switched ON. The bit line BL is connected to the ferroelectric capacitor C1, and the complementary bit line xBL is connected to the ferroelectric capacitor C0. At this time, if the potential of the plate line PL is 0 volt, the potentials of the bit line BL and of the complementary bit line xBL are each 0-volt.

Next, the plate line PL is set at the high level (e.g., VP). Then, as shown in FIG. 12, the bit line BL comes to have the potential Vi, and the complementary bit line xBL comes to have the potential V10. A potential difference between the bit line BL and the complementary bit line xBL is ΔVBL.

Next, when the sense amplifier 101 is activated, the potential difference between the bit line BL and the complementary bit line xBL is amplified. Namely, the bit line BL becomes the high level (a voltage of the power source), while the complementary bit line xBL becomes the low level. The data can be read out to the outside, corresponding to the potentials of the bit line BL and the complementary bit line xBL.

Thereafter, the plate line PL is set at the low level, the sense amplifier 101 is set in an inactive state, and the word line WL is set at the low level.

FIGS. 14(A)–14(D) are diagrams that exemplify the potentials of the bit line BL and the complementary bit line xBL in respective states on the hysteresis curves. FIG. 14(D) shows the potential V11 of the bit line BL connected to the ferroelectric capacitor C1 having the hysteresis shown in FIG. 12 and shows the potential V10 of the complementary bit line xBL connected to the complementary ferroelectric capacitor C0 having the hysteresis shown therein. As described above, the potential difference between the bit line BL and the complementary bit line xBL is ΔVBL, and it is desirable that this potential difference ΔVBL be larger. This potential difference ΔVBL changes depending on magnitudes of the parasitic capacitor CBL of the bit line BL and the complementary parasitic capacitor xCBL of the complementary bit line xBL. It should be noted that the parasitic capacitor CBL and the complementary parasitic capacitor xCBL are substantially the same, and the ferroelectric capacitor C1 and the complementary ferroelectric capacitor C0 are substantially the same. When the parasitic capacitor CBL and the complementary parasitic capacitor xCBL become too large or too small, it follows that the potential difference ΔVBL decreases, and it is disadvantageous. This condition will be explained with reference to FIGS. 14(A) through 14(C).

FIG. 14(A) is a graph exemplifying the hysteresis curves of the ferroelectric capacitors C0 and C1. Given first is an explanation of case where the parasitic capacitors CBL and xCBL are extremely small. In these elements, when the plate line PL is set at the high level (e.g., the voltage VP1), the bit line BL becomes a state Q21, and the complementary bit line xBL becomes a state Q20. In this case, the potential of the bit line BL comes to V21, and the potential of the complementary bit line xBL becomes. V20.

The ferroelectric capacitor C1 and the parasitic capacitor CBL form the series connection of the capacitor, and hence, if the parasitic capacitor CBL is small as compared with the ferroelectric capacitor C1, it follows that a larger quantity of the voltage VP1, which is to be applied to the plate line PL, is applied to the parasitic capacitor CBL. Further, a gradient of a straight line 703 representing a voltage-to-charge ratio corresponding to the parasitic capacitor CBL gets moderate as compared with the straight line 701 in FIG. 12.

Similarly, as to the ferroelectric capacitor C0 and the parasitic capacitor xCBL, the larger quantity of the voltage VP1, which is to be applied to the plate line PL, is applied to the parasitic capacitor xCBL. Moreover, a gradient of a straight line 704 representing a voltage-to-charge ratio corresponding to the parasitic capacitor xCBL becomes moderate as compared with the straight line 700 in FIG. 12.

In this case, the potential difference ΔVBL defined as a difference in value on the axis of abscissa between Q21 and Q20 on the hysteresis curves in FIG. 14(A) gets small as compared with the case in FIG. 12. FIG. 14(B) shows how the potential of the bit line BL and the potential of the complementary bit line xBL change when reading the data from the ferroelectric capacitors C1 and C0 by use of this type of storage element. To be specific, a difference between V21 and V20 is small as compared with the difference between V11 and V10.

Next, a case in which the parasitic capacitors CBL and xCBL are extremely large will be explained with reference to FIG. 14(A). In this type of element, when the plate line P1 is set at the high level (e.g, a voltage VP2), the bit line becomes a state Q31, and the complementary bit line xBL comes to a state Q30. In this case, the potential of the bit line BL becomes V31, and the potential of the complementary bit line xBL comes to V30. In this case also, a difference between V31 and V30 is small as compared with the difference between V11 and V10.

As described above, the ferroelectric capacitor C1 and the parasitic capacitor CBL form the series connection of the capacitor, and therefore, if the parasitic capacitor CBL is large as compared with the ferroelectric capacitor C1, it follows that a larger quantity of the voltage VP1, which is to be applied to the plate line PL, is applied to the ferroelectric capacitor C1. Further, a gradient of a straight line 705 representing a voltage-to-charge ratio corresponding to the parasitic capacitor CBL becomes a steep gradient as compared with the straight line 701 in FIG. 12.

Similarly, as to the ferroelectric capacitor C0 and the parasitic capacitor xCBL, if the parasitic capacitor xCBL is large as compared with the ferroelectric capacitor C0, it follows that a larger quantity of the voltage VP2, which is to be applied to the plate line PL, is applied to the ferroelectric capacitor C0. Further, a gradient of a straight line 706 representing a voltage-to-charge ratio corresponding to the parasitic capacitor xCBL becomes a steep gradient as compared with the straight line 700 in FIG. 12.

In this case also, the potential difference ΔVBL defined as a difference in value on the axis of abscissa between Q31 and Q30 on the hysteresis curves in FIG. 14(A) gets small as compared with the case in FIG. 12. FIG. 14(C) shows how the potential of the bit line BL and the potential of the complementary bit line xBL change when reading the data from the ferroelectric capacitors C1 and C0 by use of this type of memory cell. To be specific, a difference between V31 and V30 is small as compared with the difference between V11 and V10.

As described above, if the parasitic capacitors CBL and xCBL are too small or too large, as shown in FIGS. 14(B) and 14(C), the potential difference ΔVBL decreases. On the other hand, if the parasitic capacitors CBL and xCBL take proper values, as shown in FIG. 14(D), the potential difference ΔVBL increases. In other words, when the plate line PL is set at the high level, if the polarized charge Q of each of the ferroelectric capacitors C0 and C1 gets too small or too large, as shown in FIGS. 14(B) and 14(C), it follows that the potential difference ΔVBL decreases.

This is because the ferroelectric capacitor C1 and the parasitic capacitor CBL form the series connection of the capacitor and therefore (similarly as to the ferroelectric capacitor C0 and the parasitic capacitor xCBL) the voltage to be applied to the plate line is divided in inverse proportion to their capacitance ratio. In this case, an example in FIG. 11 is that the parasitic capacitors CBL and xCBL are shown as they float (fluctuate) from the ground potential.

In the configuration in FIG. 11, however, the potential is decreased by forcibly flowing the current from the floating side of the parasitic capacitors CBL and xCBL, thereby making it possible to reduce dependency of the potential difference ΔVBL on the parasitic capacitors CBL and xCBL. The invention is such that even when there are variations in the parasitic capacitors CBL and xCBL of the memory cell, the potential is reduced by forcibly extracting the electric charges from the floating side (actually the bit line BL and the complementary bit line xBL) of the parasitic capacitors CBL and xCBL, thus keeping the potential difference ΔVBL within a range that is wide to the greatest possible degree.

<Basic Configuration of Ferroelectric Memory>

Figure 1:
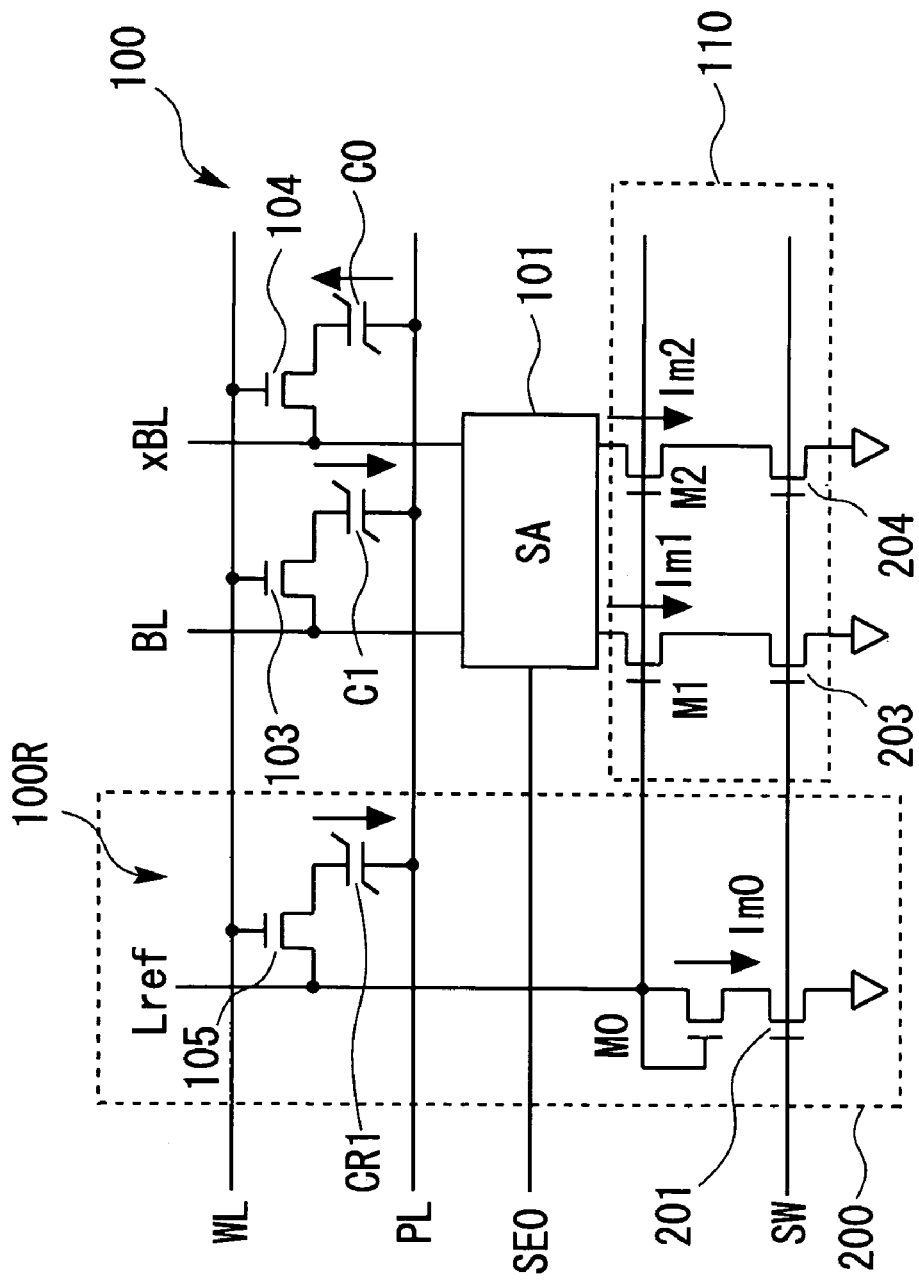
FIG. 1 is a diagram showing a basic circuit of a ferroelectric memory.

FIG. 1 shows a basic circuit of the ferroelectric memory in the embodiment. This ferroelectric memory has, similarly to the circuit in FIG. 11, a memory cell 100 including the ferroelectric capacitors C1, C0, and a sense amplifier 101 that amplifies the potential difference between the bit line BL and the complementary bit line xBL. A connecting relationship between the word line WL and the plate line PL is the same as in the case of FIG. 11.

A characteristic of this ferroelectric memory lies in a point of adding a current source 110 for extracting the electric charges from the bit line BL and the complementary bit line xBL, and a reference circuit 200 that controls the current source 110. Note that the reference circuit 200 may be provided by one for a multiplicity of memory cells 100. The current source 110 and the reference circuit 200 correspond to a potential control circuit according to the invention.

The current source 110 is connected to the bit line BL and the complementary bit line xBL, and operates to reduce the potentials of the bit line BL and of the complementary bit lines xBL when the word line WL and the plate line PL are each at the high level. The current source 110 has transistors M1, M2, and switching elements 203 and 204.

The reference circuit 200 has a reference element 100R including a transistor 105 (corresponding to a reference switching element according to the invention) and a reference ferroelectric capacitor CR1, a reference bit line Lref connected via the transistor 105 to the reference ferroelectric capacitor CR1, a transistor M0 (corresponding to a second transistor according to the invention) for extracting the electric charge from the reference bit line Lref, and a switching element 201.

The transistor 105 and the reference ferroelectric capacitor CR1, which serve as a memory cell, always generate fixed data of "1". A potential of the reference bit line Lref, which is generated by the reference circuit 200, is supplied to the gates of the transistors M1 and M2 connected to the actual memory cell 100. The transistor M0 with the drain connected to the gate, and the transistors M1, M2 connected to the actual memory cell 100, configure a current mirror circuit.

The switching elements 201, 203 and 204 connect respectively the sources of the transistors M0, M1 and M2 to the ground potential in a cutoff enable manner. The switching elements 201, 203 and 204 can be constructed of, e.g., MOSFETs. In this case, a common switch control line SW is connected to gates of the switching elements 201, 203 and 204.

An outline of a reading operation from the ferroelectric memory in FIG. 1 is given as follows. The reference ferroelectric capacitor CR1, the ferroelectric capacitor C1 and the ferroelectric capacitor C0 are connected respectively to the reference bit line Lref, the bit line BL and the complementary bit line xBL by setting the word line WL at the high level. Next, the plate line PL is set at the high level, whereby the voltage to be applied to the plate line is divided between the reference ferroelectric capacitor CR1 and the reference bit line Lref, between the ferroelectric capacitor C1 and the bit line BL, and between the ferroelectric capacitor C0 and the complementary bit line xBL, respectively.

Then, when the switching element 201 is switched ON by setting the switch control line SW at the high level, the electric charge of the reference bit line Lref is extracted on the ground potential side via the drain/gate short-circuited transistor M0 and the switching element 201. At this time, a part of the voltages into which the voltage applied to the plate line PL is divided are applied to the drain and the gate of the transistor M0. With this operation, when the voltages applied to the drain and the gate exceed a threshold voltage Vth of the transistor M0, the transistor M0 is switched ON. When the transistor M0 is switched ON, however, the voltages among the source, the drain and the gate thereof stay at the threshold voltage Vth. It is because the gate is connected directly to the drain, and therefore, when the a potential of the gate comes to the threshold voltage Vth with respect to the source, the transistor M0 is switched ON, with the result that there is no further increase in the potential. Accordingly, after the read from the reference ferroelectric capacitor CR1 has been started by setting the plate line PL and the switch control line SW at the high level, the potential of the reference bit line Lref gradually approximates the threshold voltage Vth of the transistor M0.

Further, in the circuit in FIG. 1, the transistors M0, M1 (corresponding to a first transistor according to the invention) and the transistor M2 (corresponding to a third transistor according to the invention), configure a current mirror circuit. Moreover, the switching elements 203 and 204 are kept ON in the same way as the switching element 201 is. Hence, as to the transistor M1 also, supposing that a physical dimension thereof is much the same as the transistor M0, there flows a drain current Im1 that is approximately the same as a drain current Im0 of the transistor M0. It follows that the electric charge of the bit line BL is extracted by this drain current Im1. As a result, the transistor M1 operates in the same way as the transistor M0 does, and eventually the potential of the bit line BL approximates the threshold voltage Vth of the transistor M1.

Moreover, for the transistor M2 also, supposing that a physical dimension thereof is much the same as the transistor M0, the current mirror circuit operates so that there flows a drain current Im2 that is approximately the same as the drain current Im0 of the transistor M0. However, the voltage, which is divided by the ferroelectric capacitor C0 and applied to the plate line PL, is applied to the complementary bit line xBL connected to the transistor M2. As shown in FIG. 12, the ferroelectric capacitor C0 functions as a capacitance that is equivalently small as compared with the ferroelectric capacitor C1. Therefore, the voltage applied to the complementary bit line xBL becomes relatively small. In this case, the electric charge supplied to the complementary bit line from the complementary ferroelectric capacitor C0 is likewise decreased. As a result, when the electric charge of the complementary bit line xBL is extracted by this drain current Im2, the potential decreases earlier than the bit line BL, and the potential of the complementary bit line xBL approximates the ground potential.

Figure 2:
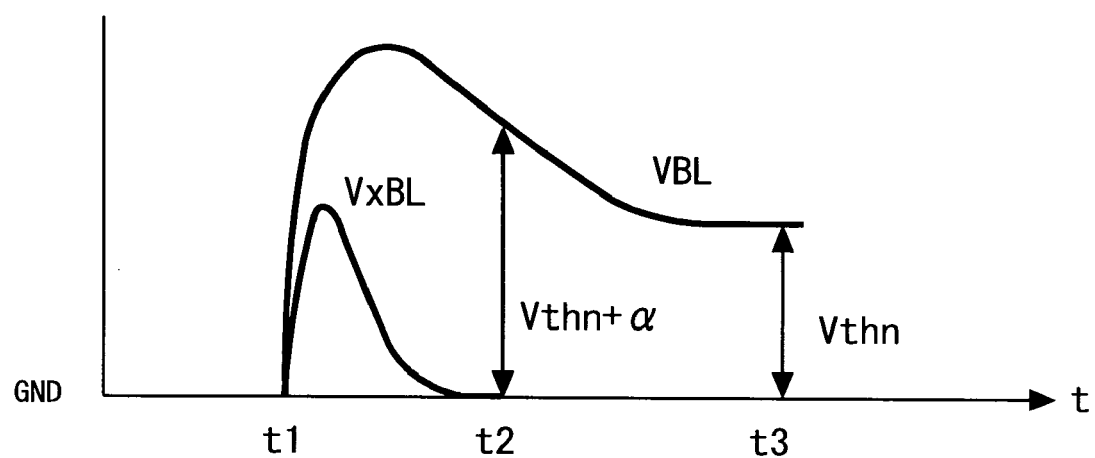
FIG. 2 is a diagram showing time-based variations in potentials of a bit line and a complementary bit line.

FIG. 2 is a graph showing time-based potential variations of the bit line BL and the complementary bit line xBL at this time. In FIG. 2, the axis of abscissa represents the time, and the axis of ordinates represents the potential of each of the bit line BL and the complementary bit line xBL.

It is now assumed that all of the word line WL, the plate line PL and the switch control line SW reach the high level at a timing t1. Then, the divided voltages of the voltage VP applied to the plate line PL are applied to the bit line BL and the complementary bit line xBL, and the respective potentials rise. The ferroelectric capacitor C1 connected to the bit line BL has, however, a larger equivalent electrostatic capacitance than the complementary ferroelectric capacitor C0 connected to the complementary bit line xBL has. Therefore, the voltage applied to the bit line BL is larger than the voltage applied to the complementary bit line xBL as shown in FIG. 12. Further, the transistor M0 is switched ON, whereby the transistors M1 and M2 building up the current mirror circuit extract the currents out of the bit line BL and the complementary bit line xBL. As a result, the potential of the bit line BL gradually decreases and reaches the threshold voltage of the transistor M1 in the vicinity of a timing t3. On the other hand, the potential of the complementary bit line xBL abruptly decreases, due to the current extracted from the transistor M2, down to the ground potential in the vicinity of a timing t2.

Figure 3:
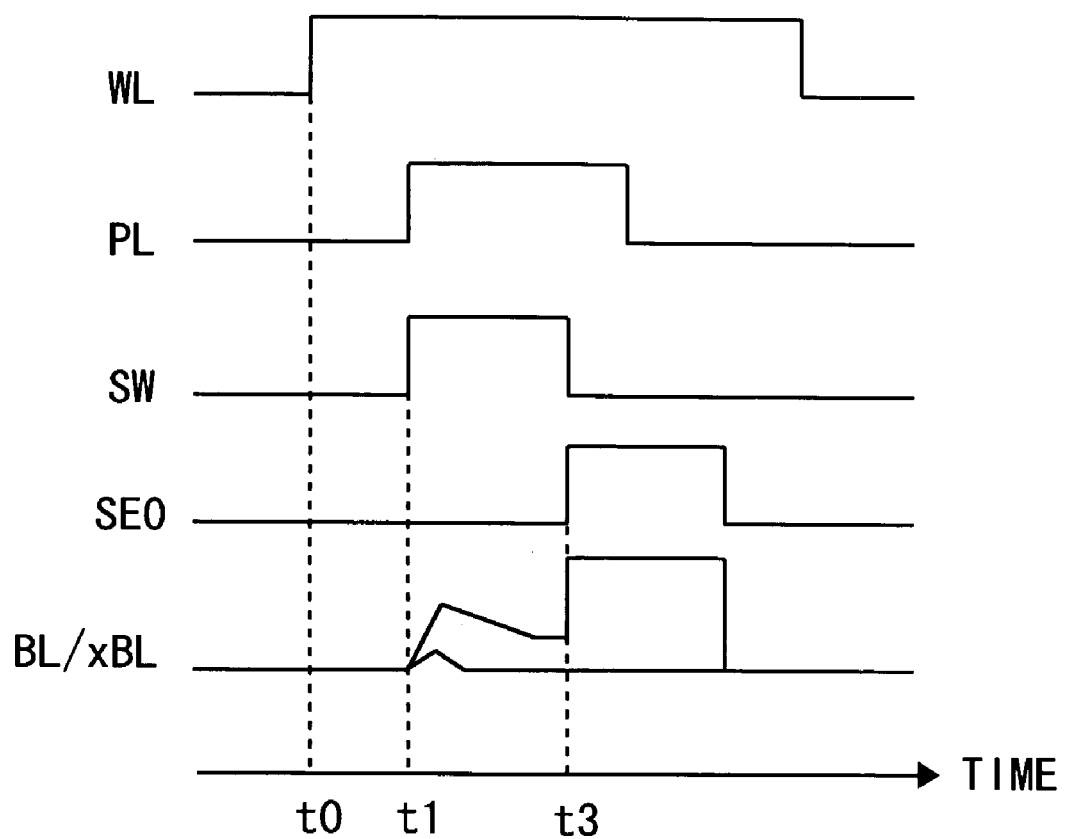
FIG. 3 is an explanatory timing chart of an operation of the ferroelectric memory.

FIG. 3 is an explanatory timing chart of the operation of the ferroelectric memory in FIG. 1. In FIG. 3, after the word line has reached the high level at a timing t0, the plate line PL and the switch control line SW come to the high level at the timing t1. The plate line PL has reached the high level (e.g., VP), whereby the potential of the reference bit line Lref rises toward a potential V21 in FIG. 14(A). The potential of the reference bit line Lref eventually, however, becomes the threshold voltage Vth of the transistor M0 under the influence of the transistor M0. At this time, the gates of the transistors M1 and M2 are supplied with the potential of the reference bit line Lref.

The potential of the bit line BL also rises toward the potential V21 in FIG. 14(A). As the transistor M1 extracts the electric charge of the bit line BL, however, the potential of the bit line BL eventually decreases down to a proper value. Finally, the potential of the bit line BL also becomes the threshold voltage Vth of the transistor M1.

Similarly, the complementary bit line xBL rises toward a potential V20 in FIG. 14(A). The transistor M2, however, extracts the electric charge of the complementary bit line xBL, and hence the potential of the complementary bit line xBL eventually decreases down to the proper value. Namely, as described above, the potential of the complementary bit line xBL abruptly decreases and becomes approximately the ground potential.

SE0 (corresponding to a point-of-time signal according to the invention) shown in FIG. 3 designates a signal for controlling an activation timing of the sense amplifier 101. When SE0 becomes the high level, the sense amplifier 101 is activated, and the potential difference ΔVBL between the bit line BL and the complementary bit line xBL is amplified. The basic circuit in the embodiment is, as shown in FIG. 3, driven so that SE0 reaches the high level at a fixed timing when the potential of the complementary bit line xBL sufficiently approximates the ground potential. This fixed timing is, for example, indicated by t3 in FIG. 2. This signal SE0 can be generated in such a way that a predetermined delay circuit delays, for instance, rise edges to the high level of the signals supplied to the word line WL, the plate line PL and the switch control line SW or pulses generated by signals having the same timing as those signals have.

As described above, irrespective of capacitance values of the bit line BL and the complementary bit line xBL, the electric charges of the bit line BL and the complementary bit line xBL are extracted by the current source 110, whereby the potentials of the bit line BL and the complementary bit line xBL are decreased down to the proper values. It is therefore possible to increase the potential difference ΔVBL between the bit line BL and the complementary bit line xBL. Namely, even when there are variations in the capacitance values of the bit line BL and the complementary bit line xBL, the potential difference ΔVBL can be ensured equal to or larger than the predetermined value (e.g., the threshold voltage Vth). In that case, there is no necessity of adding capacitance loads to the bit line BL and the complementary bit line xBL, and hence an increase in element area can be restrained.

EXAMPLE

Figure 4:
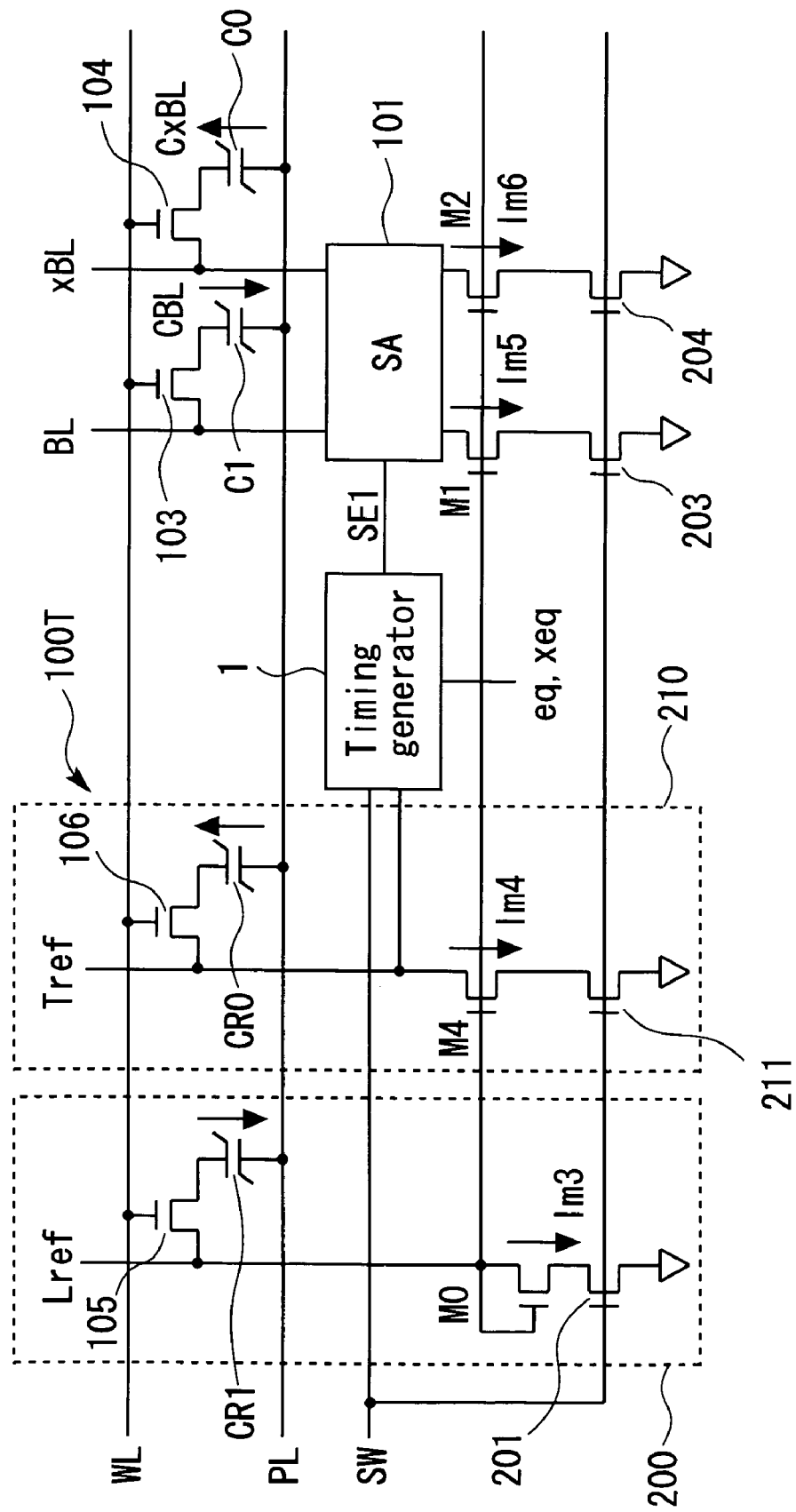
FIG. 4 is a diagram showing a configuration of a circuit of the ferroelectric memory according to a first embodiment.

FIG. 4 shows a circuit configuration of the ferroelectric capacitor memory according to the first embodiment of the invention. The ferroelectric capacitor memory in FIG. 4 has further additions, to the basic circuit illustrated in FIG. 1, of a second reference circuit 210 and a timing generation circuit 1 (corresponding to a judging circuit according to the invention). The reference circuit 210 and the timing generation circuit 1 correspond to a timing control circuit according to the invention. In FIG. 4, the configuration excluding the second reference circuit 210 and the timing generation circuit 1 is the same as the basic circuit in FIG. 1. This being the case, the same components as those in FIG. 1 are marked with the same numerals and symbols, and their explanations are omitted.

As explained in FIG. 1, the reference circuit 200 supplies the voltage to the gates of the transistors M1 and M2. Namely, the reference circuit 200 controls the potentials of the bit line BL and the complementary bit line xBL by use of the current mirror circuit built up by the transistors M0, M1 and M2. On the other hand, the second reference circuit 210 is used for determining a timing when the timing generation circuit 1 activates the sense amplifier 101.

Namely, in the basic circuit in FIG. 1, the activation timing of the sense amplifier 101 is fixed by the signal SE0.

For example, as shown in FIG. 2, however, at a much earlier stage than the timing t3 when fixedly activating the sense amplifier 101, there exists a state where the potential difference ΔVBL between the bit line BL and the complementary bit line xBL is large. The basic circuit in FIG. 1, however, utilizes a state (which is a kind of steady state) where after setting the plate line at the high level, a change in the potential VBL, which is detected from the bit line (the reference bit line), gets sufficiently small, and the potential comes to the threshold voltage Vth. Namely, in the basic circuit in FIG. 1, the sense amplifier 101 is activated at the fixed timing t3 in this steady state. Therefore, the timing when the potential difference ΔVBL can not be effectively utilized.

In the example of FIG. 4, the signal of the second reference circuit is monitored, whereby the sense amplifier 101 is activated at the more proper stage than in the case of FIG. 1, i.e., at the point of time when the potential difference ΔVBL is larger than at the timing t3. This operation enables a further improvement of the detection margin of the sense amplifier 101.

As shown in FIG. 4, the second reference circuit 210 has a memory cell 100T for reference that includes a transistor 106 (corresponding to a second reference switching element according to the invention) and a reference ferroelectric capacitor CR0 (corresponding to a complementary reference ferroelectric capacitor according to the invention) complementary to CR1, a complementary reference bit line Tref connected to the complementary reference ferroelectric capacitor CR0 via the transistor 106, a transistor M4 (corresponding to a fourth transistor according to the invention) for extracting the electric charge from the complementary reference bit line Tref, and a switching element 211. The transistor M4, in the same way as the transistors M1, M2 do, cooperates with the transistor M0 to build up the current mirror circuit.

Thus, the second reference circuit 210 functions in the same way as the circuit for reading the complementary data from the ferroelectric capacitor C0 does, except a point of having the fixed memory cell 100T and a point of having none of the sense amplifier 101. Hence, the complementary reference bit line Tref changes in its potential in the same way as the complementary bit line xBL does.

The transistor 106 and the reference ferroelectric capacitor CR0, which serve as the memory cell, generate the fixed data of "0" invariably. The potential of the complementary reference bit line Tref that is generated by the second reference circuit 200 is supplied to the timing generation circuit 1.

The timing generation circuit 1, when starting reading the data and when the switch control line SW reaches the high level, monitors a change in potential of the complementary bit line Tref. Then, when the potential of the complementary reference bit line Tref approximates a predetermined range, e.g., the ground potential in FIG. 2, the timing generation circuit 1 generates an activation signal SE1 for the sense amplifier 101. With this configuration, in the ferroelectric memory in FIG. 4, the sense amplifier 101 starts an amplifying process in a state where the potential difference ΔVBL between the bit line BL and the complementary bit line xBL is larger than the threshold voltage Vth (the timing t2) shown in FIG. 2.

Figure 5:
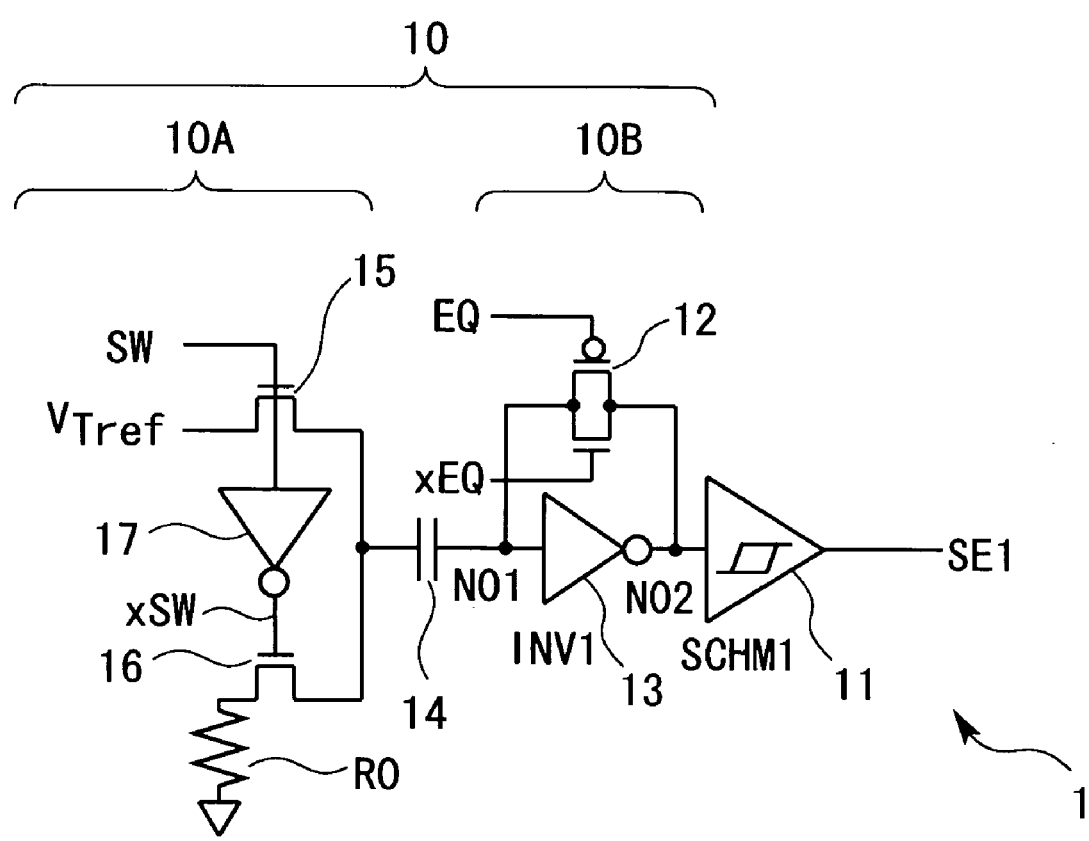
FIG. 5 is a diagram showing an example of a configuration of a timing generation circuit according to the first embodiment.

FIG. 5 shows an example of a configuration of the timing generation circuit 1. This timing generation circuit 1 has a level shift circuit 10 (corresponding to a level shift circuit according to the invention) that shifts an AC level of a potential detection signal VTref of the complementary reference bit line Tref, and a Schmidt circuit 11 (corresponding to a signal level judging circuit according to the invention) that judges whether an output signal of the level shift circuit 10 falls within a predetermined range or not.

The level shift circuit 10, which is separated into a front stage and a rear stage, includes a front-stage input circuit 10A, a capacitor 14 (corresponding to a capacitor element according to the invention) that transmits a fluctuation component of signals from the input circuit 10A, and a rear-stage amplifier circuit 10B adding a DC component to the fluctuation component passing through the capacitor 14 and thus amplifying these components.

The rear-stage amplifier circuit 10B has an inverter 13 (corresponding to an amplifier according to the invention) and an equalizer 12 (corresponding to an equalizer circuit according to the invention) constructed by combining two pieces of complementary switching elements and controlled in a cutoff enabled manner by signals EQ and xEQ complementary to each other. The inverter 13 has an input terminal N01 and an output terminal N02 that are connected in the cutoff enabled manner by the equalizer 12. Further, the input circuit 10A is connected via the capacitor 14 to the inverter 13. Moreover, an output of the inverter 13 is connected to the Schmidt circuit 11.

Considered now is a case in which the signal EQ is at the low level, and the signal xEQ is at the high level. In this case, it follows that the input terminal N01 and the output terminal N02 of the inverter 13 are short-circuited through the equalizer 12. Then, as known well, it follows that an output voltage (and an input voltage) of the inverter 13 is balanced in the vicinity of ½ of the power source voltage (which corresponds to a matching potential according to the invention). There is considered, for example, such a case that the inverter 13 is a CMOS (Complementary Metal Oxide Semiconductor) transistor, wherein a p-type MOS transistor and an n-type MOS transistor are combined, and the input signal is inputted to a common gate N01. In this case, a source of the p-type MOS transistor is connected to the power source voltage, drains of the p- and n-type MOS transistors configure a common output terminal N02, and a source of the n-type MOS transistor is connected to the ground potential. In a state where the output voltage and the input voltage are balanced with each other, it takes a form that a potential difference ranging from the power source voltage down to the ground potential is voltage-divided by the p-type MOS transistor and the n-type MOS transistor. Therefore, it follows that both of the common gate and the common drain get steady in the vicinity of ½ of the power source voltage. Further, a signal of ½ of the power source voltage is inputted to the gates of the p- and n-type MOS transistors, and a voltage of ½ of the power source voltage is applied also to between the source and the drain, so that both of the p- and n-type MOS transistors are incompletely in the ON-state, wherein a through-current flows to the ground via the p- and n-type MOS transistors from the power source. As a result, both of the common gate and the common drain get steady in the vicinity of ½ of the power source voltage.

The input circuit 10A constituting the front stage of the level shift circuit 10 receives an input of the potential detection signal VTref of the complementary reference bit line Tref, and has a switching element 15 (corresponding to a third switching element according to the invention) performing control of whether or not the passage of the potential detection signal VTref is permitted by a control signal to the gate that is supplied from the switch control line SW, an inverter 17 that invert-outputs the control signal of the switching line SW, a switching element 16 (corresponding to a fourth switching element according to the invention) of which a gate is supplied with a switching line control signal xSW inverted by the inverter 17, and a resistor R0 (corresponding to a resistor element according to the invention) of which one terminal is connected to the capacitor 14 via the switching element 16 and the other terminal is connected to the ground potential.

A terminal (corresponding to an input side terminal according to the invention) on the side of the input circuit 10A of the capacitor 14 is connected to the ground potential via the switching element 16 and the resistor R0. Further, the potential detection signal VTref is inputted to the terminal on the side of the input circuit 10A of the capacitor 14 via the switching element 15. Moreover, an output-side terminal (corresponding to an output-side terminal according to the invention) opposite to the input-side of the capacitor 14 is connected to the inverter 13.

With this type of configuration, when the control signal of the switch control line SW is at the low level, the switching element 15 blocks the passage of the potential detection signal VTref. In this state, since an output xSW of the inverter 17 becomes the high level, the switching element 16 is switched ON, and the terminal on the side of the input circuit 10A of the capacitor 14 is connected via the resistor R0 to the ground potential.

At this time, in the state where the amplifier circuit 10B is, as described above, balanced on the input side N01 and the output side N02 in the vicinity of ½ of the power source voltage, the terminal on the side of the amplifier circuit 10B of the capacitor 14 becomes ½ of the power source voltage. Therefore, the current flows to the ground potential from the input circuit 10A side of the capacitor 14 via the resistor R0. Consequently, the input circuit 10A side of the capacitor 14 has a higher potential than the ground potential by a voltage drop due to this current. In this state, the inverter 13 is, it being statically cut off by the capacitor 14, balanced on the input side N01 and on the output side N02.

Considered in this state is a case in which the switch control line SW reaches the high level, and the potential detection signal VTref is inputted. Then, the resistor R0 is cut off from the capacitor 14 by the switching element 16, and it follows that the potential detection signal VTref with the ground potential serving as a DC level is inputted to the capacitor 14. A fluctuation component of the potential detection signal VTref is inputted to the inverter 13 via the capacitor 14.

The inverter 13, in the circuit configuration that does not include the resistor R0, amplifies the potential detection signal VTref originally in the state where the input side N01 and the output side N02 are balanced, and thereafter returns again to the state where the input side N01 and the output side N02 are balanced.

In the circuit in FIG. 5, however, the inverter 13, as the input and the output thereof are balanced in a relatively high state from the ground potential due to a voltage drop in the current flowing across the resistor R0, receives an input of the potential detection signal VTref with the ground potential set as the DC level (which herein connotes a reference level at which the potential detection signal VTref is in a non-signal state (silence state)) by the switching element 15, and thereby receives an input of a signal in which a lower potential than in the balanced-state is set as the reference level. Hence, as the balance between the input side and the output side is lost, when the potential detection signal VTref is invert-amplified, the inverter 13 does not return to the state where the input side N01 and the output side N02 are balanced, and comes to a state in which the output voltage deflects toward the power source voltage side. The output voltage of this inverter 13 is inputted to the Schmidt circuit 11. As known well, the Schmidt circuit 11 is switched ON when the input signal (the output voltage of the inverter 13) reaches a predetermined level, and generates the timing control signal SE1.

Figure 6:
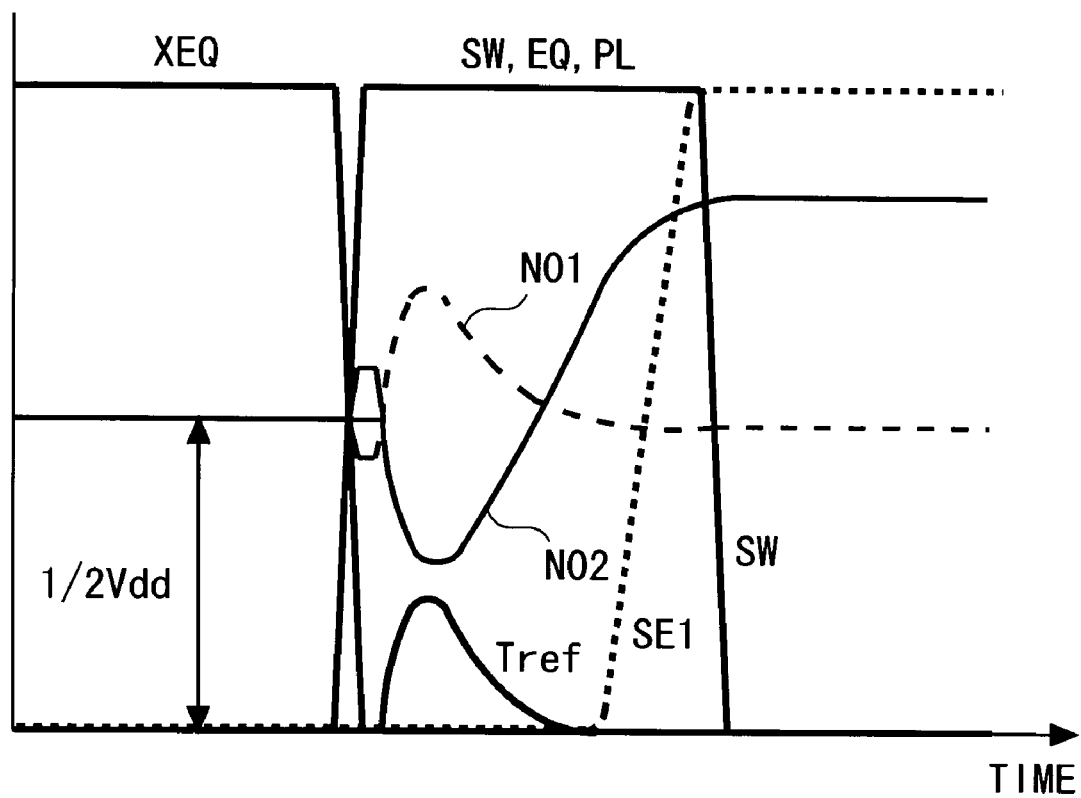
FIG. 6 is a diagram showing waveforms of respective portions of the timing generation circuit.

FIG. 6 shows a waveform of the potential of each portion of the timing generation circuit 1. In FIG. 6, the axis of abscissa represents the time, and the axis of ordinates represents the potential of each portion. In FIG. 6, initially the signal xEQ is at the high level, and therefore the input side N01 and the output side N02 of the inverter 13 are balanced in the vicinity of ½ of the power source voltage.

Next, the signal xEQ becomes the low level, while the signal EQ gets to the high level, the input side N01 and the output side N02 of the inverter 13 are separated. Further, at this time, when the switch control line SW becomes the high level, it follows that the potential detection signal VTref is inputted to the amplifier circuit 10B. The reference potential of the potential detection signal VTref, equivalently, changes in a unimodal shape, wherein a potential lower than the potential at which the input side N01 and the output side N02 of the inverter 13 are balanced is set as a reference level. Accordingly, (the potential of) the output side N02 of the inverter 13 changes in the direction opposite to the potential of N01 but does not return to the initially-balanced potential even when the potential detection signal VTref returns to the reference level, and deflects largely toward the power source voltage side, thus coming to a steady state. Then, when the output side N02 exceeds a predetermined reference value, the output SE1 of the Schmidt circuit 11 changes to the high level. Note that FIG. 6 shows a change in the potential of the plate line PL together with the changes in the potentials of the respective portions.

Figure 7:
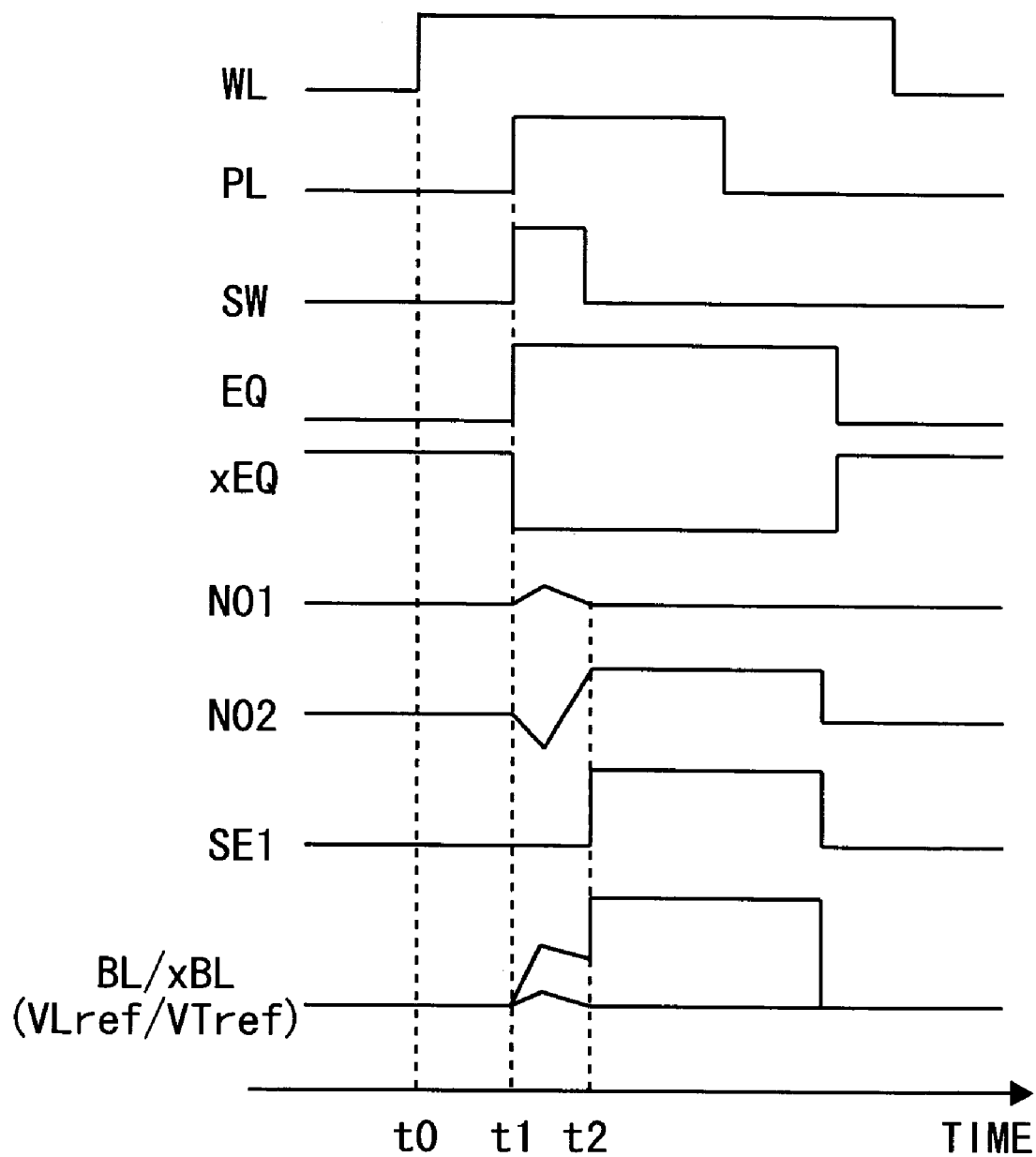
FIG. 7 is a diagram showing a timing chart of the circuit in the first embodiment.

FIG. 7 shows a timing chart of the circuit (FIG. 4) in the first embodiment. Initially, the control signal EQ of the equalizer 12 is at the low level, while the signal xEQ is at the high level. In this case, as described above, the inverter 13 of the timing generation circuit 1 is balanced in the vicinity of ½ of the power source voltage.

To begin with, the word line WL becomes the high level (timing t0). As a result, the transistors 103, 104, 105 and 106 are switched ON, and the ferroelectric capacitors C1, C0 and the reference ferroelectric capacitors CR1, CR0 are connected respectively to the bit line BL, the complementary bit line xBL, the reference bit line Lref and the complementary reference bit line Tref.

Next, the control signal EQ of the equalizer 12 becomes the high level (timing t1), while the signal xEQ comes to the low level, whereby the input side N01 and the output side N02 of the inverter 13 of the timing generation circuit 1 are separated. The inverter 13 is, however, kept in the balanced state. Furthermore, when the plate line PL and the switch control line SW reach the high level, the detection signal VTref of the complementary reference bit line Tref is inputted to the input side N01 of the inverter 13. The inverter 13 invert-amplifies the detection signal VTref and outputs the invert-amplified signal from the output side N02.

Then, the Schmidt circuit 11, when (the potential of) the output side N02 of the inverter 13 exceeds a predetermined potential (timing t2), sets the timing signal SE1 at the high level. In this case, setting of a threshold of the Schmidt circuit 11 enables the timing signal SE1 to be set at the high level in such a case that, e.g., the potential of the input side N01 of the inverter 13, i.e., the detection signal VTref of the complementary reference bit line Tref, sufficiently approximates the ground potential.

Note that in the circuit in FIG. 4, the transistors M0, M1, M2 and M4 build up the current mirror circuit, and hence the potential of the bit line BL connected to the ferroelectric capacitor C1 changes in the same way as the potential of the reference bit line Lref connected to the reference ferroelectric capacitor CR1 does.

In the basic circuit shown in FIG. 1, in the state where the potential of the bit line BL gets steady at the threshold voltage Vth defined as a kind of steady state, the sense amplifier 101 is activated by setting the signal SE0 at the high level at the fixed timing. At this time, a margin with which the sense amplifier 101 detects the potential difference between the bit line BL and the complementary bit line xBL, is approximately the threshold voltage Vth of the transistor M1.

On the other hand, in the circuit in FIG. 4 that has been exemplified in the example, when the detection signal VTref of the complementary reference bit line Tref sufficiently approximates the ground potential, the sense amplifier 101 is activated by setting the timing signal SE1 at the high level. Therefore, as shown in FIG. 2, the margin with which the sense amplifier 101 detects the potential difference between the bit line BL and the complementary bit line xBL, can be set to a value of Vth+a, which is much larger than the threshold voltage Vth of the transistor M1. Note that in FIG. 2, the timing t2 for activating the sense amplifier 101 is the timing when (the potential of) the complementary bit line xBL (i.e., the reference complementary bit line Tref) is substantially coincident with the ground potential, however, the sense amplifier 101 may also be activated at a point of time anterior to the timing t2 by selecting the threshold of the Schmidt circuit 11.

Further, in the circuit shown in FIG. 5, a case of setting small a value of the resistor R0 and a case of setting it large are examined by comparing these cases with each other. When the value of the resistor R0 is set small, the voltage drop decreases (alternatively, a time constant between the capacitor 14 and the resistor R0 is small, and the steady state is quickly reached), and hence there is a small degree to which the balance between the input and the output of the inverter 13 is lost due to the switching operations of the switching elements 15, 16. Therefore, the timing when the output side N02 of the inverter 13 shown in FIG. 6 deflects to the power source voltage, is delayed. Accordingly, in this case, even when the threshold of the Schmidt circuit 11 is the same as in the example 1, the timing when the timing signal for activating the sense amplifier 101 is set at the high level, is delayed.

Further, conversely, when increasing the value of the resistor R0, the voltage drop augments (or, the time constant between the capacitor 14 and the resistor R0 rises, and the steady state is reached more moderately), and hence there is a large degree to which the balance between the input and the output of the inverter 13 is lost due to the switching operations of the switching elements 15, 16. Therefore, the change on the output side N02 of the inverter 13 shown in FIG. 6 becomes large, and the timing of deflecting to the power source voltage gets early. Accordingly, in this case, even when the threshold of the Schmidt circuit 11 is the same as in the example 1, the timing when the timing signal SE1 for activating the sense amplifier 101 is set at the high level, gets early.

Thus, it is possible to adjust the timing for activating the sense amplifier 101 by adjusting the value of the resistor R0. Namely, the resistor R0 is a means (an adjusting parameter) for adjusting the timing for activating the sense amplifier 101.

In any case, the second reference circuit 210 and the timing generation circuit 1 generate the timing signal SE1 for detecting the potential difference between the bit line BL and the complementary bit line xBL. Then, based on this timing signal SE1, the sense amplifier 101 detects a potential difference between two pieces of complementary data before these two pieces of complementary data outputted to the bit line BL and the complementary bit line xBL are stabilized. Thus, the second reference circuit 210, the timing generation circuit 1 and the sense amplifier 101 correspond to a detection circuit according to the invention.

Second Embodiment

A second embodiment of the invention will be described with reference to the drawings in FIGS. 8 through 10. In the first embodiment, the timing for activating the sense amplifier 101 detecting the potential difference ΔVBL between the bit line BL and the complementary bit line xBL of the memory cell, is determined in a way that detects the change in potential of the complementary reference bit line Tref when reading from the reference ferroelectric capacitor CR0.

In the case of such a configuration, an advantage is that the sense amplifier 101 can be activated at the timing when the potential difference ΔVBL between the bit line BL and the complementary bit line xBL keeps a value larger than the threshold voltage Vth in the case of the basic circuit (FIG. 1) from the change in potential of the complementary reference bit line Tref. In such a configuration, however, the characteristic of the reference ferroelectric capacitor CR0 or CR1 deteriorates, the hysteresis is weakened, and a problem might arise if a width between the hysteresis curves is narrowed.

For example, in the hysteresis curves in FIG. 12, the width between the hysteresis curves is large, and there is a large difference in terms of the equivalent capacitance (between a polarized charge variation quantity Δq11/voltage VC and Δq10/VbC) between the state Q11 corresponding to the ferroelectric capacitor C1 and the state Q10 corresponding to the complementary ferroelectric capacitor C0. Accordingly, in this case, as shown in FIG. 4, the electric charge of the complementary bit line xBL can be quickly extracted by the transistor M0 extracting the electric charge from the reference bit line Lref and by the transistor M1 configuring the current mirror circuit. As shown in FIG. 6 or FIG. 7, the potential of the complementary reference bit line Tref or the complementary bit line xBL quickly approximates the ground potential, and the activation signal SE1 reaches the high level at a comparatively early timing.

When the hysteresis is weakened and when the width between the hysteresis curves is narrowed, however, there is no difference in the equivalent capacitance between the reference capacitors CR1 and CR0. Then, there decreases a speed at which the transistor M4 extracts the electric charge of the complementary reference bit line Tref, and the change in the potential of the complementary reference bit line Tref is delayed.

Namely, as to the reference capacitor CR1, as compared with the case exhibiting a strong hysteresis, the equivalent electrostatic capacitance decreases (a gradient of the tangent line to the hysteresis curve decreases as compared with Q11 in FIG. 12), and, in the voltage applied to the plate line PL, the divided voltage of the reference capacitor CR1 rises, while the divided voltage VLref to the reference bit line Lref decreases. As a result, the current flowing out to the ground potential from the transistor M0 is reduced. On the other hand, as to the complementary reference capacitor CR0, as compared with the case exhibiting the strong hysteresis, the equivalent electrostatic capacitance increases (the gradient of the tangent line to the hysteresis curve increases as compared with Q10 in FIG. 12), and, in the voltage applied to the plate line PL, the divided voltage of the reference capacitor CR0 rises, while the divided voltage VTref to the complementary reference bit line Tref increases. Therefore, the electric charge that must be extracted by the transistor M4 rises. For these reasons, the time for which the potential VTref of the complementary reference bit line Tref decreases toward the ground potential, gradually increases as the hysteresis deteriorates.

As a result, the time till the timing generation circuit 1 sets the activation signal SE1 at the high level is gradually delayed. Note that the delay of the change in the potential due to the deterioration of the characteristic might occur similarly as to the bit line BL and the complementary bit line xBL that are connected to the ferroelectric capacitors C1 and C0.

Explained in the second embodiment is a ferroelectric memory capable of surely activating the sense amplifier 101 also in the case where the characteristic of the ferroelectric capacitor deteriorates. Other configurations and operations of the ferroelectric memory in the second embodiment are the same as those in the first embodiment. This being the case, the same components as those in the first embodiment are marked with the same numerals and symbols, and their explanations are omitted.

Figure 8:
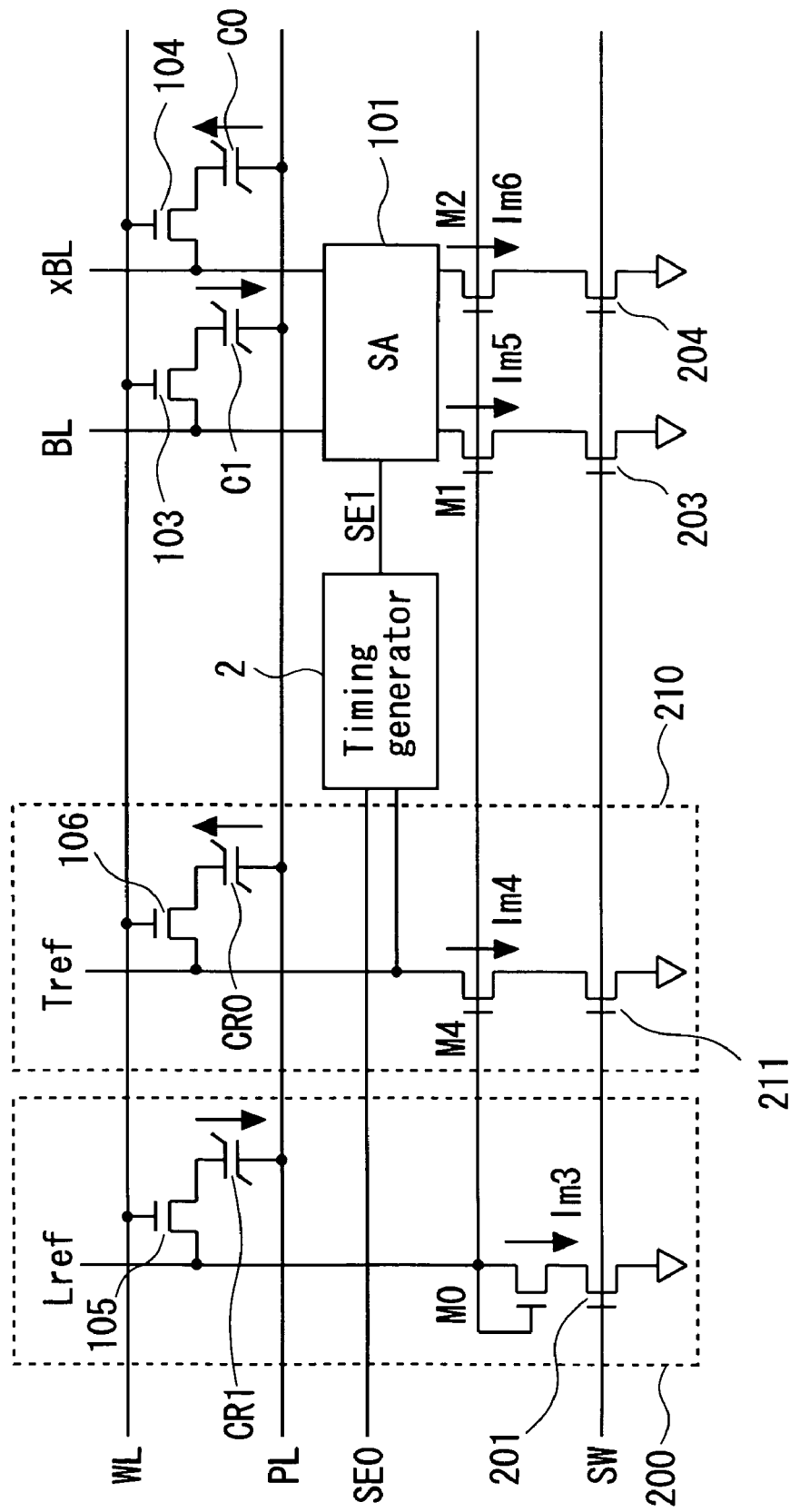
FIG. 8 is a diagram showing an example of the circuit of the ferroelectric memory in a second embodiment.

FIG. 8 shows an example of a circuit of the ferroelectric memory in the second embodiment. This ferroelectric memory has a timing generation circuit 2 that replaces the timing generation circuit 1 in FIG. 4. The timing generation circuit 2 is different from the timing generation circuit 1 in FIG. 4 in terms of utilizing the activation signal SE0 for activating the sense amplifier 101 at a fixed timing. Other components in FIG. 8 are the same as those in the case of FIG. 4.

Figure 9:
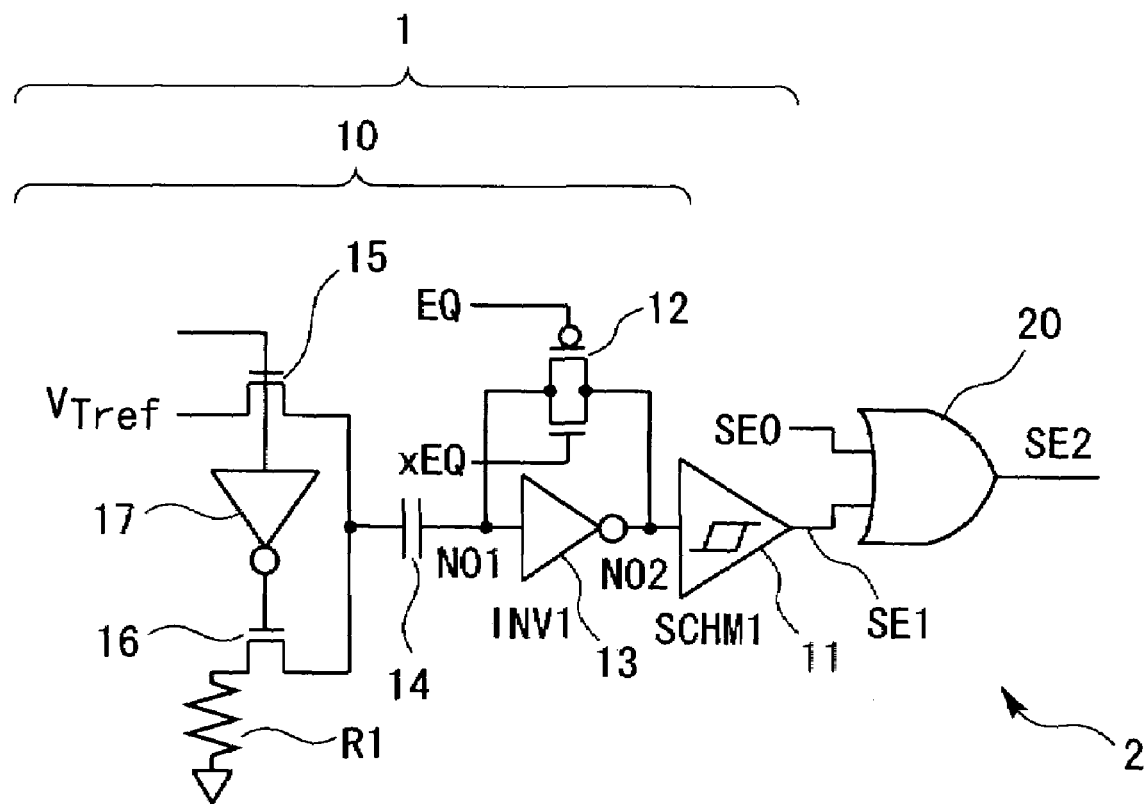
FIG. 9 is a diagram showing a configuration of the timing generation circuit according to the second embodiment.

FIG. 9 shows a configuration of the timing generation circuit 2. The timing generation circuit 2 takes a construction of adding an OR gate (corresponding to a circuit for activating the sense amplifier according to the invention) at a rear stage of the Schmidt circuit 11 of the timing generation circuit 1 (see FIG. 4). As in FIG. 9, the output terminal of the Schmidt circuit 11 is connected to one input terminal of the OR gate 20. Further, the activation signal SE0 for activating the sense amplifier 101 originally at the fixed timing, is inputted to the other input terminal of the OR gate 20.

The timing when the activation signal SE0 reaches the high level is a timing when the sense amplifier 101 should be, it is deemed based on an empirical value or an experimental value, activated. This timing is, if the ferroelectric memory has a normal non-deteriorated characteristic, as indicated by t3 in FIG. 2, set at a point of time when the change in the bit line potential VBL sufficiently approximates the steady state.

As in FIG. 9, in the second embodiment, the fixed activation signal SE0 and the output signal SE1 of the Schmidt circuit 11 are inputted to the input terminals of the OR gate 20. Therefore, when at least one of the fixed activation signal SE0 and the output signal SE1 of the Schmidt circuit 11 becomes the high level, the output SE2 of the OR gate 20 reaches the high level.

Figure 10:
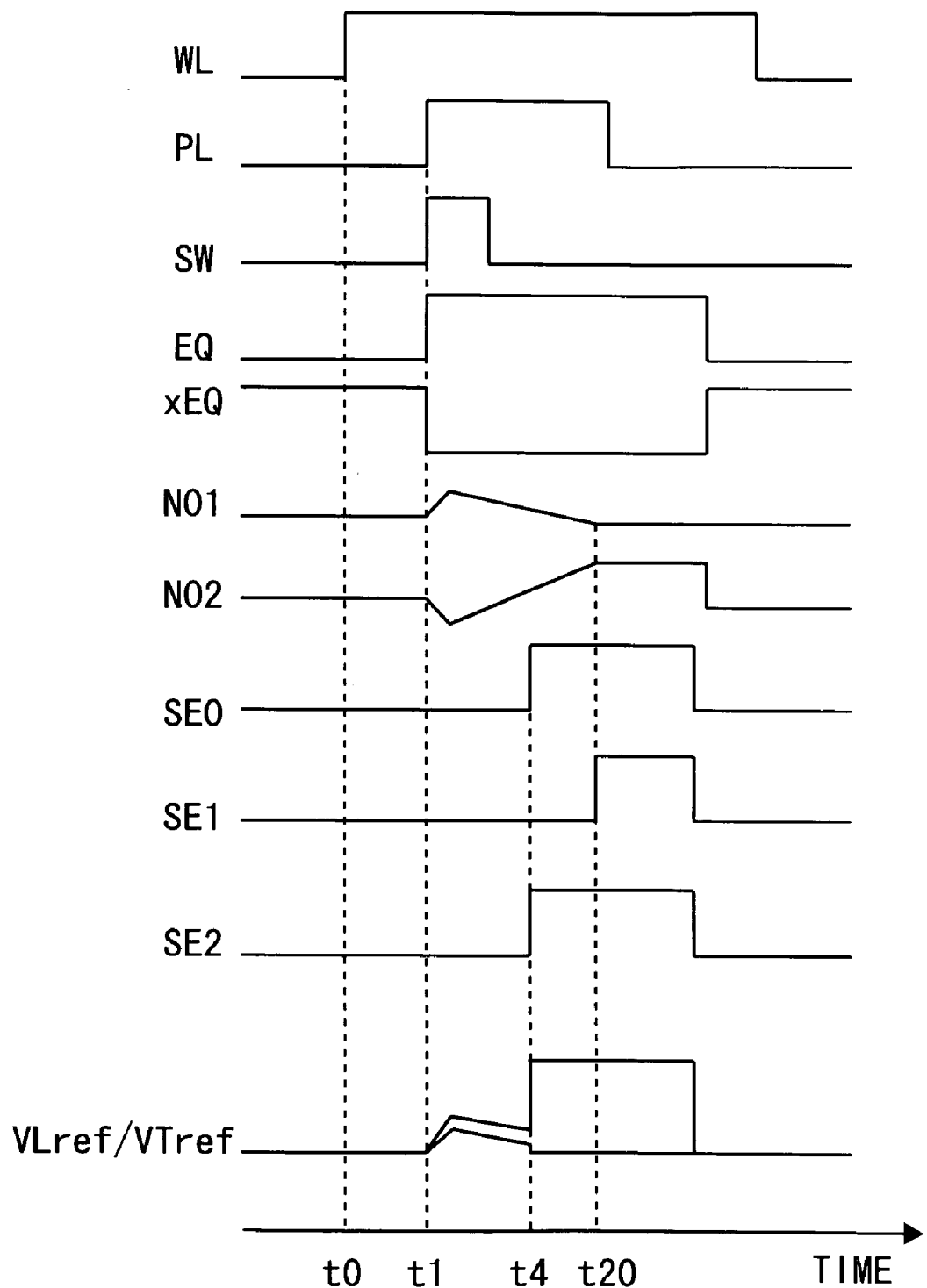
FIG. 10 is a diagram showing a timing chart of the ferroelectric memory in the second embodiment.

FIG. 10 shows a timing chart of the ferroelectric memory in the second embodiment. In this ferroelectric memory, the reference ferroelectric capacitors CR1 and CR0 deteriorate, and the potential of the complementary reference bit line Tref can not be early lowered by the transistor M4 connected within the current mirror circuit.

Accordingly, the rise in the potential of the output side N02 of the level shift circuit 10 is moderate as compared with the case of the strong hysteresis as in the first embodiment. Therefore, a timing t20 when the output of the Schmidt circuit 11 becomes the high level is delayed as compared with the timing t2 in the case of the first embodiment.

As in FIG. 10, however, the activation signal SE0 comes to the high level at a timing t4 (which is later than the timing t2 in the first embodiment but earlier than the timing t20 when the output SE1 of the Schmidt circuit 11 is set ON with the deterioration of the hysteresis as in the second embodiment). As a result, by an OR operation of the activation signal SE0 and the output signal SE1 of the Schmidt circuit 11, the output of the timing generation circuit 2 becomes the high level at the timing when the activation signal SE0 reaches the high level. Hence, according to this timing generation circuit 2, for the worst, the sense amplifier 101 can be activated at the timing when the fixed-timing-based activation signal SE0 reaches the high level.

MODIFIED EXAMPLE

In the embodiments, the explanations have been made such that the n-type MOSFET is assumed to be each of the switching elements 103, 104, 105, 106, 201, 203, 204 and 211, and the switching element is switched ON when the gate voltage becomes the high level. The embodiment of the invention is not limited to this configuration. Namely, a p-type MOSFET that is switched ON at the low level may also be used as each of the switching elements.

Further, if the timing for starting (activating) the sense (amplifier) exists, as obvious from FIG. 2, before stabilizing the potentials of the two bit lines to which the complementary data are outputted, the potential difference between these pieces of complementary data becomes large, thereby enabling the stable readout of the data. More desirably, the data can be read out more stably by detecting the potential difference between those pieces of complementary data in the vicinity of the timing when one of the two potentials of the complementary data is stabilized ahead.

OTHERS

The disclosures of Japanese patent application No. JP2005-197945 filed on Jul. 6, 2005 including the specification, drawings and abstract are incorporated herein by reference.

What is claimed is:
1. A ferroelectric storage device comprising:
a ferroelectric capacitor retaining data by polarization;
a bit line via which the data is inputted and outputted to the ferroelectric capacitor;
a first switching element selectively connecting the ferroelectric capacitor and the bit line;
a first transistor connected to the bit line and to a reference potential;
a reference ferroelectric capacitor retaining fixed data;
a reference bit line via which the data is inputted and outputted to the reference ferroelectric capacitor;

a reference switching element selectively connecting the reference ferroelectric capacitor and the reference bit line;

a second transistor connected to the reference bit line and the reference potential;

a potential control circuit controlling a potential of the bit line when the bit line is connected to the ferroelectric capacitor, and controlling a potential of the reference bit line when the reference bit line is connected to the reference ferroelectric capacitor; and a timing control circuit controlling a detection timing for detecting the data of the bit line.

2. A ferroelectric storage device according to claim 1, wherein the potential control circuit, together with the first transistor and the second transistor, builds up a current mirror circuit.

3. A ferroelectric storage device according to claim 1, further comprising:

a complementary ferroelectric capacitor retaining data complementary to the data retained by the ferroelectric capacitor;

a complementary bit line via which the data is inputted and outputted to the complementary ferroelectric capacitor;

a second switching element selectively connecting the complementary ferroelectric capacitor and the complementary bit line; and a third transistor connected to the complementary bit line and the reference potential, wherein the potential control circuit, together with the first transistor, the second transistor and the third transistor, builds up a current mirror circuit, and the timing control circuit sets the detection timing to a point of time before the potential difference between the bit line and the complementary bit line reaches a steady state.

4. A ferroelectric storage device according to claim 3, further comprising:

a complementary reference ferroelectric capacitor retaining data complementary to the data retained by the reference ferroelectric capacitor;

a complementary reference bit line via which the data is inputted and outputted to the complementary reference ferroelectric capacitor;

a second reference switching element selectively connecting the complementary reference ferroelectric capacitor and the complementary reference bit line; and a fourth transistor connected to the complementary reference bit line and the reference potential, wherein the potential control circuit, together with the first transistor, the second transistor, the third transistor and the fourth transistor, builds up a current mirror circuit, and the timing control circuit includes a judging circuit that judges whether or not a potential of the complementary reference bit line reaches a predetermined range.

5. A ferroelectric storage device according to claim 4, wherein the judging circuit includes a level shift circuit shifting a reference level of a detection signal detected from the complementary reference bit line, and a signal level judging circuit judging whether the detection signal with the reference level shifted reaches a predetermined level or not.

6. A ferroelectric storage device according to claim 5, wherein the level shift circuit includes a capacitor element cutting off a direct current component and allowing passing of a fluctuation component of the detection signal therethrough;

an amplifier amplifying the fluctuation component passing through the capacitor element;

an equalizer circuit approximately matching an input signal level and an output signal level of the amplifier with a predetermined matching potential;

a resistor element shifting an input side terminal of the capacitor element from the reference potential by connecting the input side terminal of the capacitor element receiving an input of the detection signal to the reference potential;

a third switching element having the detection signal inputted to the input side terminal of the capacitor element; and a fourth switching element separating the resistor element from the input side terminal when the detection signal is inputted to the input side terminal of the capacitor element, and wherein the input side of the amplifier to which the capacitor element is connected, is shifted from the matching potential by separating the resistor element.

7. A ferroelectric storage device according to claim 1, further comprising a sense amplifier amplifying a potential difference between the bit line and the complementary bit line, wherein the timing control circuit generates an activation signal that controls an activation timing of the sense amplifier.

8. A ferroelectric storage device according to claim 7, further comprising a circuit activating the sense amplifier by at least one of a limit point-of-time signal representing a limit point of time of the activation timing for the sense amplifier and the activation signal.

9. A ferroelectric storage device comprising:

ferroelectric capacitors each retaining complementary data;

bit lines receiving respective outputs of pieces of complementary data from the ferroelectric capacitors; and a detection circuit detecting a potential difference between these pieces of complementary data before the two pieces of complementary data outputted to the bit lines are stabilized.

10. A ferroelectric storage device according to claim 9, further comprising a potential control circuit decreasing the potentials of the bit lines in a case where the data retained by the ferroelectric capacitors are read to the bit lines.

11. A ferroelectric storage device comprising:

ferroelectric capacitors each retaining complementary data;

bit lines receiving respective outputs of pieces of complementary data from the ferroelectric capacitors;

a plate line used for applying voltages to the ferroelectric capacitors;

a word line used for giving a data output instruction of the ferroelectric capacitors;

a voltage control circuit decreasing the potentials of the bit lines in a case where the data output instruction is given through the word line and the voltages are applied via the plate line; and a detection circuit detecting a potential difference between these pieces of complementary data before the two pieces of complementary data outputted to the bit lines are stabilized.

* * * * *

UNITED STATES PATENT AND TRADEMARK OFFICE
CERTIFICATE OF CORRECTION

PATENT NO.       : 7,200,029 B2                                              Page 1 of 1
APPLICATION NO.  : 11/258227
DATED            : April 3, 2007
INVENTOR(S)      : Hiroshi Yoshioka It is certified that error appears in the above-identified patent and that said Letters Patent is hereby corrected as shown below:

<u>On Title Page, Item (56)</u>

Please insert under FOREIGN PATENT DOCUMENTS -- KR 0506459 07/2005 and KR 0506450 07/2005--.

Signed and Sealed this

Seventeenth Day of July, 2007

JON W. DUDAS
*Director of the United States Patent and Trademark Office*

UNITED STATES PATENT AND TRADEMARK OFFICE
CERTIFICATE OF CORRECTION

PATENT NO. : 7,200,029 B2
APPLICATION NO. : 11/258227
DATED : April 3, 2007
INVENTOR(S) : Hiroshi Yoshioka It is certified that error appears in the above-identified patent and that said Letters Patent is hereby corrected as shown below:

Col. 20, Line 22-26 should read

7. A ferroelectric storage device according to claim ~~1~~3, further comprising a sense amplifier amplifying a potential difference between the bit line and the complementary bit line, wherein the timing control circuit generates an activation signal that controls an activation timing of the sense amplifier.

Signed and Sealed this

Second Day of June, 2009

JOHN DOLL
*Acting Director of the United States Patent and Trademark Office*